United States Patent
Bogner et al.

(10) Patent No.: US 11,635,314 B2
(45) Date of Patent: *Apr. 25, 2023

(54) METHODS, APPARATUSES AND SYSTEMS FOR DATA CONVERSION

(71) Applicant: Infineon Technologies AG, Neubiberg (DE)

(72) Inventors: Peter Bogner, Wernberg (AT); Andrea Cristofoli, Villach (AT); Michael Kropfitsch, Koettmannsdorf (AT); Jochen O. Schrattenecker, Reichenthal (AT)

(73) Assignee: Infineon Technologies AG, Neubiberg (DE)

( * ) Notice: Subject to any disclaimer, the term of this patent is extended or adjusted under 35 U.S.C. 154(b) by 243 days.

This patent is subject to a terminal disclaimer.

(21) Appl. No.: 16/425,005

(22) Filed: May 29, 2019

(65) Prior Publication Data
US 2019/0383651 A1    Dec. 19, 2019

(30) Foreign Application Priority Data
Jun. 13, 2018 (DE) .......................... 102018114092.4

(51) Int. Cl.
*G01D 18/00* (2006.01)
*G06F 16/25* (2019.01)

(52) U.S. Cl.
CPC ......... *G01D 18/008* (2013.01); *G06F 16/258* (2019.01)

(58) Field of Classification Search
None
See application file for complete search history.

(56) References Cited

U.S. PATENT DOCUMENTS

| | | | | |
|---|---|---|---|---|
| 5,499,027 A * | 3/1996 | Karanicolas | ........ | H03M 1/1061 341/162 |
| 5,900,904 A | 5/1999 | Okada et al. | | |
| 5,966,676 A * | 10/1999 | Fujiwara | ............ | G01N 33/0006 250/252.1 |
| 6,232,897 B1 * | 5/2001 | Knusen | ................. | H03M 3/388 341/120 |
| 6,462,684 B1 * | 10/2002 | Medelius | ............... | H03M 1/004 341/120 |
| 7,710,303 B2 * | 5/2010 | Wojewoda | .......... | H03M 1/1028 341/155 |

(Continued)

OTHER PUBLICATIONS

Kay et al. "A Practical Technique for Minimizing the Number of Measurements in Sensor Signal Conditioning Calibration," Texas Instruments, Application Report SBOA111—Jun. 2005, downloaded from https://www.ti.com/lit/an/sboa111/sboa111.pdf, downloaded on Sep. 9, 2021 (Year: 2005).*

*Primary Examiner* — Eman A Alkafawi
*Assistant Examiner* — Denise R Karavias
(74) *Attorney, Agent, or Firm* — Slater Matsil, LLP

(57) ABSTRACT

In accordance with an embodiment, a method for monitoring a data converter configured to convert data using a calibration determined by a calibration data record includes calibrating the data converter in order to determine a corresponding multiplicity of time associated calibration data records at a multiplicity of different times; and determining a state of the data converter based on comparing at least one of the multiplicity of time associated calibration data records with a comparison data record.

21 Claims, 5 Drawing Sheets

(56) References Cited

U.S. PATENT DOCUMENTS

| | | | |
|---|---|---|---|
| 8,816,886 B1* | 8/2014 | Warner | H03M 1/1057 |
| | | | 341/120 |
| 9,281,832 B1 | 3/2016 | Thiagarajan | |
| 9,774,337 B1 | 9/2017 | Chao et al. | |
| 2003/0052803 A1* | 3/2003 | Engl | H03M 1/1023 |
| | | | 341/120 |
| 2003/0146863 A1* | 8/2003 | Jonsson | H03M 1/1004 |
| | | | 341/120 |
| 2004/0102914 A1* | 5/2004 | More | H03M 1/1038 |
| | | | 702/99 |
| 2006/0176197 A1* | 8/2006 | McNeill | H03M 1/1004 |
| | | | 341/120 |
| 2006/0211044 A1 | 9/2006 | Green | |
| 2008/0165040 A1* | 7/2008 | Rotchford | H03M 1/1047 |
| | | | 341/120 |
| 2008/0239939 A1 | 10/2008 | Parnaby et al. | |
| 2009/0243907 A1* | 10/2009 | Nazemi | H03M 1/1042 |
| | | | 341/161 |
| 2011/0148682 A1* | 6/2011 | Rigby | H03M 1/188 |
| | | | 341/155 |
| 2013/0293402 A1* | 11/2013 | Naudet | H03M 1/1071 |
| | | | 341/120 |
| 2015/0032403 A1* | 1/2015 | King | G01R 31/2879 |
| | | | 702/107 |
| 2016/0182073 A1 | 6/2016 | Speir et al. | |
| 2017/0045578 A1 | 2/2017 | Okuda et al. | |
| 2017/0127089 A1 | 5/2017 | Shi et al. | |
| 2018/0003745 A1* | 1/2018 | Oh | G08B 3/10 |
| 2019/0383651 A1 | 12/2019 | Bogner et al. | |
| 2019/0386673 A1 | 12/2019 | Schrattenecker et al. | |

* cited by examiner

METHODS, APPARATUSES AND SYSTEMS FOR DATA CONVERSION

This application claims the benefit of German Application No. 102018114092.4, filed on Jun. 13, 2018, which application is hereby incorporated herein by reference in its entirety.

TECHNICAL FIELD

This disclosure relates generally to methods, apparatuses and systems for data conversion.

BACKGROUND

Data converters for transforming signals are used in a variety of ways, for example in electronic circuits.

Data converters are understood to mean apparatuses designed to convert a first signal, which has a first signal format, into a second signal, which has a second signal format. By way of example, an optical signal can be converted into an electronic signal, for vice versa.

Examples of data converters are in particular analog to digital converters, which convert an analog signal into a digital signal, and digital to analog converters, which convert a digital signal into an analog signal. In many instances of application, it is necessary and/or useful to perform a calibration of data converters. The aim of such a calibration can be, by way of example, for the conversion of the data to meet certain requirements, for example to have a sufficiently linear characteristic. Using a calibration, it may thus be possible, by way of example, for signals generated by means of a nonlinear data conversion to be linearized by means of a subsequent correction. Such linearization can be performed by means of correction terms, the correction terms being able to be determined as part of the calibration.

Data converters may be subject to aging/degradation processes that can lead to impediment of their characteristic and ultimately to their failure. Data converters can also fail at random.

SUMMARY

According to one exemplary embodiment, a method for monitoring a data converter is provided, wherein the data converter is configured to convert data using a calibration determined by a calibration data record.

The method according to this exemplary embodiment comprises: calibrating the data converter in order to determine a corresponding multiplicity of time associated calibration data records at a multiplicity of different times.

Further, the method comprises determining a state of the data converter based on comparison of at least one of the multiplicity of time associated calibration data records with a comparison data record.

According to a further exemplary embodiment, an apparatus for data conversion is provided. Said apparatus comprises a data converter, wherein the data converter is configured to convert data using a calibration determined by a calibration data record. Further, the apparatus comprises a calibration circuit. This calibration circuit is configured to determine a corresponding multiplicity of time associated calibration data records at a multiplicity of different times. Further, the apparatus comprises a monitoring circuit configured to determine a state of the data converter based on comparison of at least one of the multiplicity of time associated calibration data records with a comparison data record.

According to a further exemplary embodiment, a system for converting data is provided, wherein the system comprises a data converter. In this case, the data converter is configured to convert data using a calibration determined by a calibration data record.

Further, the system comprises a monitoring circuit for the data converter, wherein the monitoring circuit for the data converter is configured to perform a method according to the exemplary embodiments described above and below.

DETAILED DESCRIPTION OF ILLUSTRATIVE EMBODIMENTS

Figure 1A:
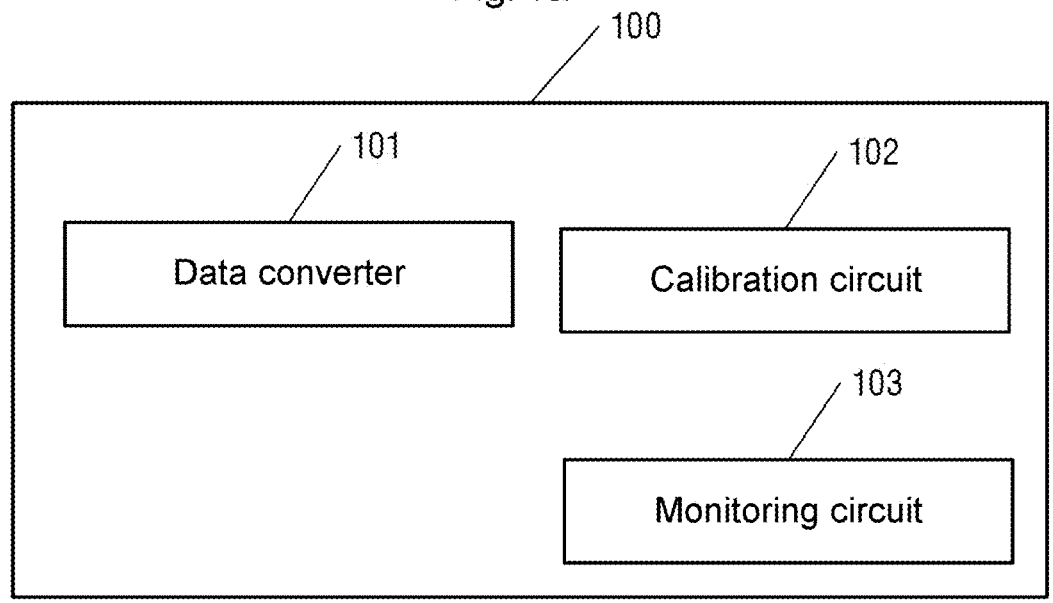
FIG. 1a shows an apparatus for data conversion according to various exemplary embodiments.

Various exemplary embodiments are described in detail below with reference to the appended drawings. These exemplary embodiments are merely intended to be understood as an example and are not intended to be regarded as limiting. By way of example, in other exemplary embodiments, some of the features or components described can be omitted and/or replaced by alternative features or components. Features or components of different exemplary embodiments can be combined in order to form further exemplary embodiments. Variations and modifications described for one exemplary embodiment can also be applied to other exemplary embodiments. In addition, other features or components than those described or shown can be provided, for example features or components used in conventional data converters, in particular analog to digital converter circuits or digital to analog converter circuits.

Direct connections or couplings shown in the drawings or described below, i.e. electrical connections or couplings without interposed elements (for example simple metal conductor tracks), can also be produced by an indirect connection or coupling, i.e. a connection or coupling comprising one or more additional interposed elements, and vice versa, so long as the general operation of the connection or coupling, for example providing a voltage, providing a current, conducting an electromagnetic wave or providing a control signal, is substantially retained.

The methods described above and below can also be stored, for control by means of a computer, as instructions on a materially existent storage medium, for example as instructions for the monitoring circuit 103. The monitoring circuit may be implemented on a PC comprising a memory and a processor, but also as hardwired logic, an ASIC or another embodiment, for example generally by means of hardware, software, firmware or combinations of these.

In the figures, identical reference signs denote the same or similar elements. The figures are schematic representations of various exemplary embodiments. Elements depicted in the figures are not necessarily depicted to scale. Rather, the different elements depicted in the figures are reproduced such that their function and general purpose becomes comprehensible to a person skilled in the art.

Numerical values cited in connection with exemplary embodiments are used merely for the purposes of explanation. Numerical values are not intended to be interpreted as limiting and are dependent on the choice of parameters and a respective implementation.

Some data converters require calibration in order to operate in a well-defined manner and/or to have a desired behavior. By way of example, calibration can be used to compensate for a design dependent nonlinear response from a data converter by virtue of the converted signals being scaled, e.g. on the basis of a calibration, in order to attain a linear response. Calibration can also make allowance for a change in properties of the data converter on the basis of the ambient conditions, and can at least partially compensate therefor. By way of example, the properties of data converters can change on the basis of external parameters, for example a variation in the process (i.e. during the manufacturing process for the data converter), the applied supply voltage and/or the temperature (referred to as "PVT variation" of process, voltage and temperature), and on the basis of aging processes.

Calibration of a data converter is thus understood to mean a process in which values of calibration parameters are determined that can form the basis for the conversion of the data by the data converter.

A calibration can be effected for example by means of a known signal provided as an input signal to the data converter. The data converter performs a conversion of the input signal and delivers an output signal. This conversion involves calibration parameters. A comparison of the output signal with a desired output signal (for example a linear characteristic of the output signal from an applied input signal having a linear characteristic) allows the values of the calibration parameters to be adapted in order to bring about a linear characteristic for the output signal. Such calibrations can e.g. compensate for variations in ambient conditions, manufacturing tolerances and aging processes at least to a certain extent.

The sum total of the calibration parameters (one or more calibration parameters) is referred to in this application as a calibration data record. Each of the calibration parameters can have one value.

If the properties of a data converter change for example over time, for example on account of aging processes, this can be ascertained in some exemplary embodiments by virtue of the calibration data records determined at different times being compared with one another.

In some exemplary embodiments, this can have the advantage that it may be possible to observe the state, for example the aging state, of data converters in order to be able to react to or anticipate failure of the data converter.

A time is understood to mean a particular time. It can be a time that is relevant to a process, for example a calibration, for example it can be a timestamp indicating a time at which the process was completed or begun, for example the time at which a calibration was completed.

Calibration data records are thus determined at different times by a calibration in exemplary embodiments. Calibration data records can take into consideration ambient parameters at the calibration times, for example by means of a normalization. The calibration data records can be determined at regular, i.e. periodic, or irregular intervals of time.

When the calibration data records are determined at regular intervals of time, the determining is effected at times that are substantially, for example in a manner limited by process related inaccuracies in the time denomination, at fixed intervals from one another. By way of example, this can be ensured by a counter having a stipulated counting rate, wherein the counter is reset when a prescribed value is reached, and determining is effected. Many alternative options for producing a periodic time interval are known to a person skilled in the art.

The determining can also be effected continuously, i.e. an apparatus performs fresh determining as soon as previous determining is complete. In this case, the duration of a determination step prescribes the time at which the subsequent determining begins. Therefore, it may be possible for the frequency of determining to change on the basis of external parameters, for example the temperature.

The determining can also be effected at random times. To this end, a random number generator can be used in order to bring about a decision as to whether or not determining is meant to be effected. This can have the advantage that the determining can be less susceptible to periodic (interfering) influences, for example electromagnetic signals at a particular frequency that are present in the surroundings.

The determining can also be effected at irregular intervals of time by virtue of determining being effected on the basis of external conditions, for example on the basis of ambient parameters, e.g. temperature and/or power supply, or on the basis of operating scenarios, for example on the basis of an apparatus used or a received signal being switched on.

The methods can be performed according to the exemplary embodiments above, the calibration data records being able to be determined at regular or irregular intervals of time.

The state of the data converter can be inferred according to various exemplary embodiments by means of comparison of calibration data records determined at different times.

The comparison of at least one of the multiplicity of time associated calibration data records with a comparison data record can be effected in different manners in this case and, in some exemplary embodiments, can be effected by comparing one calibration data record with another calibration data record of the multiplicity of data records. In other exemplary embodiments, the comparison data record can comprise at least one threshold value. A combination of threshold values and values of at least one other calibration data record is also possible. More complex comparisons, based on multiple calibration data records, are also possible. A comparison can comprise the determining of one or more order relations, that is to say for example "the same", "greater than", "less than". The comparison can also comprise the determining of one or more differences between values. In this case, a difference can be expressed for example as a difference or quotient of values of one or more calibration parameters of the calibration data records, but other methods of apportionment are also possible.

Values of the at least one calibration data record and of the comparison data record that correspond to one another can be compared. In this regard, comparison data records can comprise a multiplicity of comparison values. Values correspond to one another if they characterize the same properties. If a calibration data record comprises for example five values and is determined in the same manner at different times, then in each case the first value of the first calibration data record and the first value of a second calibration data record, the second value of the first calibration data record and the second value of a second calibration data record, etc., correspond to one another. The second calibration data record can be used as a comparison data record. The same can apply to the comparison data record, for example if the comparison data record is likewise a calibration data record. In other examples, the comparison data record can comprise comparison values. By way of example, comparison values may be threshold values that can each be defined for corresponding calibration data record values. If a comparison data record comprises for example a threshold value for a calibration parameter, for example for a calibration parameter having the index 3, then the third calibration parameter of a calibration data record is associated with this threshold value.

A threshold value may be an absolute threshold value. In some exemplary embodiments, a threshold value may also be defined on the basis of other parameters, for example ambient parameters, for example the temperature. Threshold values may also, as described above and below, be defined for differences between values of calibration parameters. Relatively defined threshold values of this kind can also be referred to as difference threshold values. Difference threshold values may likewise be defined on the basis of ambient parameters. By way of example, a difference threshold value for a difference in the respective third value of a calibration data record may be defined on the basis of temperature. As such, for example the difference threshold value may be 10 for a temperature of 120° C. for the absolute value of the difference in the values, but 5 in the case of a temperature of 20° C., the temperature being able to be detected in each case at the time of determination of the calibration data records, or else being able to be determined only once, for example at the time of determination of the second calibration data record. Such methods can be used for example when a reference calibration data record is used, which is determined in some examples for standard ambient conditions.

The comparison can also take into consideration the time elapsed between the determining of the calibration data records, for example a gradient or an integral of the values can be produced, for example a numerical gradient. A gradient or multiple gradients, integrals, etc., can be determined quantitatively as a difference. The comparison can also comprise the analysis of a multiplicity of time associated calibration data records for a multiplicity of times. This can be done using standard methods, as are known from curve discussion and filter development, for example. Threshold values can also be used for these obtained variables. By way of example, the comparison data record can comprise one or more threshold values for gradients of individual calibration parameters.

A result of the comparison can be a qualitative statement, for example a logic statement such as "values are the same", "value 1 is greater than value 2", "value 1 is less than value 2", wherein "value" relates to values of one or more calibration parameters of the calibration data records. The result can also be a quantitative statement, for example a difference between the values with or without an arithmetic sign, or a gradient taking into consideration the difference between the values over time.

The state of a data converter according to various exemplary embodiments is a qualitative and/or quantative description of the data converter, in particular in respect of its usability. The state of a data converter can comprise a measure of a degradation state. A degradation state indicates how far aging or another degradation of the data converter has advanced. In this case, a degradation state permits quantative inference of the usability of the data converter. Further, it may be possible to produce a forecast for the further usability of the data converter on the basis of empirical values.

According to various exemplary embodiments, a measure of a degradation state can be provided in the form of a signal that can be transmitted to other units, for example to a monitoring system in a vehicle.

Measure of a degradation state is understood to mean that this measure qualitatively and/or quantatively reveals whether and to what extent there is a degradation state. By way of example, the measure can comprise a piece of logical information such as "in order", "not in order". The measure can also comprise a multiplicity of pieces of logical information, for example "assembly 1 in order", "assembly 2 not in order", etc.

By way of example, the measure can also comprise quantative information, such as a "life condition indication". This can be based on a model of a life expectancy for a subassembly, and for example can be determined by a correlation between measurement data of the apparatus and representative data allowing the apparatus to be assigned to a failure distribution. By way of example, a percentage can be provided as a measure, for example "health: 85%", or multiple percentages characterizing different properties, for example "assembly 1 health: 99%, assembly 2 health: 20%". It may be also possible for the measure to comprise both qualitative and quantative degradation information, for example "assembly 1 health: 99%, assembly 1 in order, assembly 2: 20%, assembly 2 not in order".

Figure 1B:
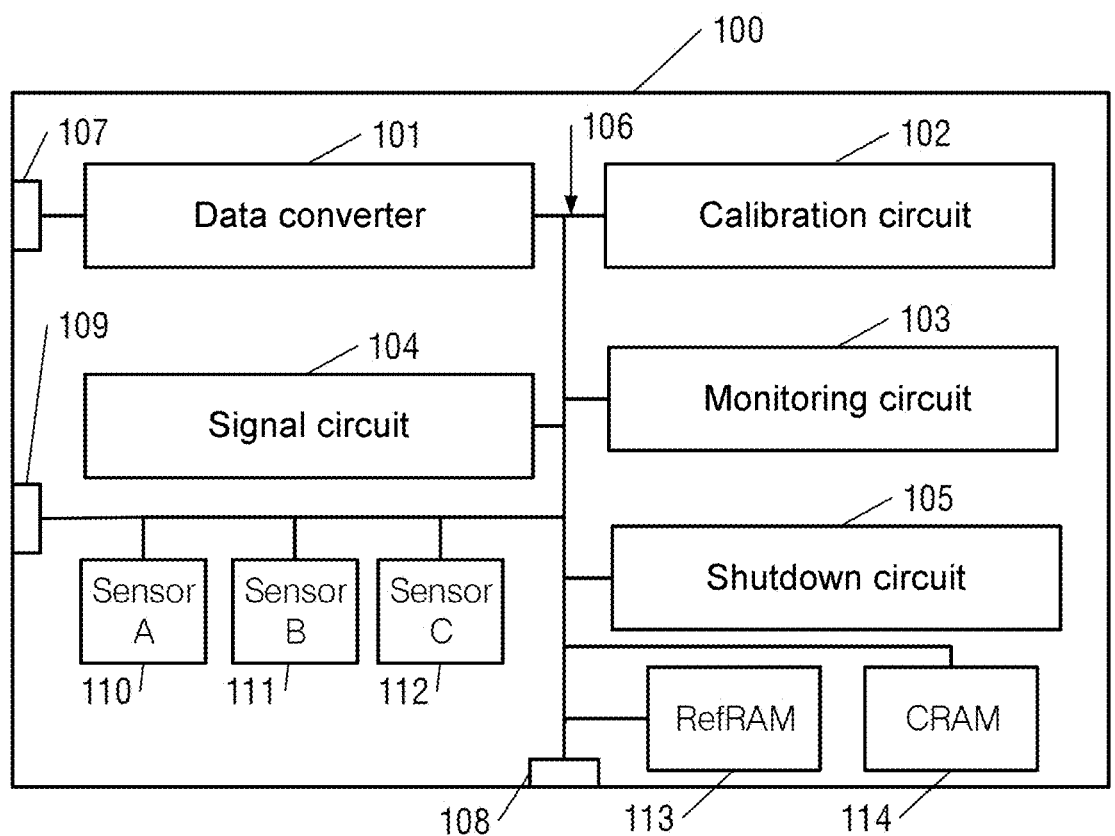
FIG. 1b shows an apparatus for data conversion according to various exemplary embodiments.

FIG. 1a and FIG. 1b show systems 100 for converting data. The system 100 comprises various functional units 101 112. In the exemplary embodiment of FIG. 1a, the system comprises a data converter 101, a calibration circuit 102 and a monitoring circuit 103. The data converter 101 can be an analog to digital converter and/or a digital to analog converter in some exemplary embodiments, for example a pipeline analog to digital converter, an integrating analog to digital converter, a delta sigma analog to digital converter, a flash analog to digital converter, a successive approximation (SAR) digital to analog converter, a direct digital to analog converter, a parallel digital to analog converter or a delta sigma digital to analog converter. Alternatively, other or multiple analog to digital converters, digital to analog converters and/or other combinations of analog to digital converters and digital to analog converters, as are known from SAR analog to digital converters, for example, are possible.

According to various exemplary embodiments, the data converter 101 can be calibrated by the calibration circuit 102 at various times, with time associated calibration data records being able to be determined as described above and below. These calibration data records can then be monitored by the monitoring circuit 103 and compared with one another for various times, for example. If there is a severe disparity among the calibration data records, this can indicate a problem with the data converter 101, i.e. can indicate a degradation state as explained above.

The system 100 can be embodied either by means of discrete units coupled to one another or as a single apparatus, for example in the form of an integrated circuit. It is also possible for single instances of the functional units shown to be embodied on a single circuit and for other modules to be embodied separately therefrom. By way of example, the data converter 101 and the calibration circuit 102 may be embodied as an integrated circuit, but the monitoring circuit 103 may be present as a separate assembly. Arbitrary other variants thereof are also possible.

It is possible for a self-calibrating data converter to be provided. In some exemplary embodiments, a self-calibrating data converter can comprise the data converter 101 and calibration circuit 102. A monitoring functionality can be provided by an external component, such as the monitoring circuit 103. The monitoring circuit 103 may be provided as part of the self-calibrating data converter, or externally thereto, and may be implemented in various ways, e.g. hardware, or software/firmware in conjunction with a processor.

FIG. 1b shows a variation of the exemplary embodiment of FIG. 1a having multiple additional components. It should be noted that these additional components may be implemented independently of one another, i.e. in some exemplary embodiments it is also possible for just one or some of these components to be provided.

In exemplary embodiments as shown in FIG. 1b, a sensor A no, a sensor B in and a sensor C 112 are present, for example. These sensors 110 112 can deliver measurement data pertaining to ambient parameters to the monitoring circuit 103, said measurement data being able to be taken into consideration by the monitoring circuit for comparing the calibration data records, and/or can deliver them to the calibration circuit 102. Exemplary embodiments taking into consideration the influence of ambient parameters when monitoring the data converter are described below in connection with FIG. 3.

On top of that, in addition to the units of FIG. 1a, the system 100 in FIG. 1b has a signal circuit 104, a shutdown circuit 105, a bus system 106, inputs 107, outputs 108 and input/outputs 109. Additionally, the exemplary embodiment shown in FIG. 1b has three sensors 110 112 as described above, said sensors being able to capture ambient parameters such as temperature and/or supply voltage, for example. In some exemplary embodiments, it may be also be possible to receive sensor data via the input/outputs 109 or to provide them to other circuits.

The signal circuit 104 may be configured to provide a signal, based on the state of the data converter. The signal circuit 104 allows the state of the data converter 101 as determined by the monitoring circuit 103 to be communicated to other systems, for example via the outputs 108 or the input/outputs 109. Therefore, the signal circuit 104 can provide an interface function. This can have the advantage that a warning signal can be provided to a user of the device in which the system 100 is installed. By way of example, a maintenance lamp can be activated in a motor vehicle.

The shutdown circuit 105 may be configured to shut down the data converter 101 based on the state of the data converter.

The shutdown circuit 105 can in particular cause deactivation of the data converter 101 if the monitoring circuit 103 comes to the conclusion that the data converter 101 is operating erroneously. This can be advantageous, in particular in the case of systems designed to have multiple redundancy or redundancy, if the erroneously operating data converter delivers incorrect values. In this case, a further data converter (not depicted) can continue to operate correctly.

As well as that, the system 100 can have a first memory 113 and a second memory 114. The memories 113, 114 may also be embodied together. In some exemplary embodiments, there may also be just one of the memories 113, 114 present.

The first memory 113 may be for example a reference memory RefRAM 113. The second memory 114 may be for example a correction memory CRAM 114. The memories 113, 114 may be embodied as volatile memories, e.g. a random access memory (RAM), as a nonvolatile memory within a chip, e.g. as a flash memory or as a one-time programmable memory (OTP). They may also be embodied as a nonvolatile memory within a module, for example as a second chip, for example in combination with a microcontroller. By way of example, CRAM 113 and/or RefRAM 114 may also be part of the monitoring circuit 103 and/or of the calibration circuit 102 and/or of the data converter 101, but other integrations are also possible. RefRAM 114 and CRAM 113 may each be embodied differently and/or as a combination of different memory types. By way of example, RefRAM 113 may be embodied as a one-time programmable nonvolatile memory (OTP NVM), and the CRAM 114 may be embodied as a volatile memory, e.g. RAM, or as a nonvolatile memory, such as a flash memory.

By means of the functional units shown, various exemplary embodiments of the system 100 may be capable of performing single, some or all instances of the methods described below. The methods described below can be performed wholly or in part by the monitoring circuit 103. The methods can also be performed independently of the system 100, however.

Figure 2:
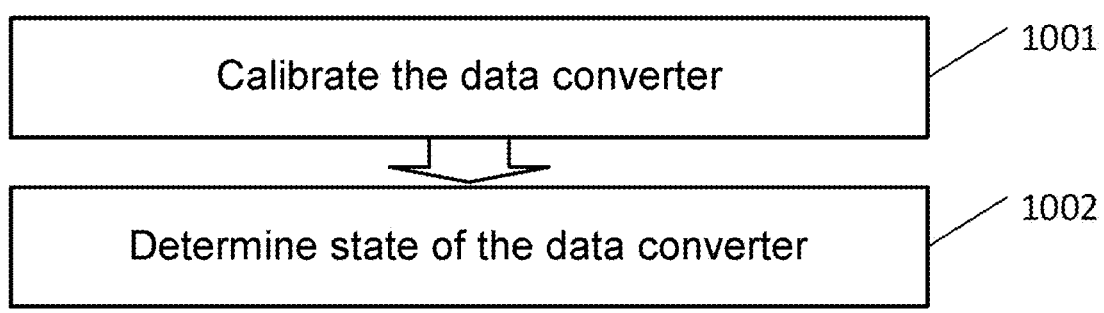
FIG. 2 shows a flowchart for a method for monitoring a data converter according to various exemplary embodiments.

FIG. 2 shows a flowchart for a method for monitoring a data converter according to various exemplary embodiments.

The data converter can be for example the data converter 101 of FIG. 1. The data converter is configured to convert data, based on a calibration. The calibration may be determined on the basis of a calibration data record as described. At 1001, the data converter is calibrated at a multiplicity of different times. The different times can be at regular or irregular intervals of time, as described above. The calibration therefore determines a multiplicity of time associated calibration data records. By way of example, a first calibration data record can be determined at a first time, a second calibration data record can be determined at a second time and a third calibration data record can be determined at a third time.

At 1002, a state of the data converter is determined. The determining is based on comparison of at least one of the multiplicity of time associated calibration data records with a comparison data record. By way of example, the comparison can be based on comparison of at least two of the multiplicity of time associated calibration data records, for example of at least one of the multiplicity of time associated calibration data records with at least one other of the time associated calibration data records. By way of example, the state can be provided based on a comparison of the first calibration data record with the second calibration data record, or of the third calibration data record with the first calibration data record. In some exemplary embodiments, it is possible for the comparison, as described above, to be based on more than two calibration data records. Similarly, as described above, various methods for determining the state and for comparing the calibration data records can be applied. In other exemplary embodiments, the comparison data record can comprise at least one threshold value, as described above and below.

This method, like apparatuses according to the system 100, can have the advantage that a change in a state of the data converter over time can be detected on the basis of the comparison of the calibration data records. The method allows observation of the state of the data converter under conditions of use in the course of operation, for example when the data converter is installed in an apparatus, for example a vehicle. This can have the advantage that aging dependent effects, which are not always observable during production tests or during service intervals, become observable. As a result, it may be possible, to observe a long term trend in the state of the data converter in order to observe aging processes. Similarly, it may be possible to detect sudden failure of the data converter, for example effects that arise on account of an open circuit, for example on account of electromigration or radiation damage, for example on account of cosmic radiation. In such cases, it may be particularly simple to detect a change in the calibration data.

Figure 3:
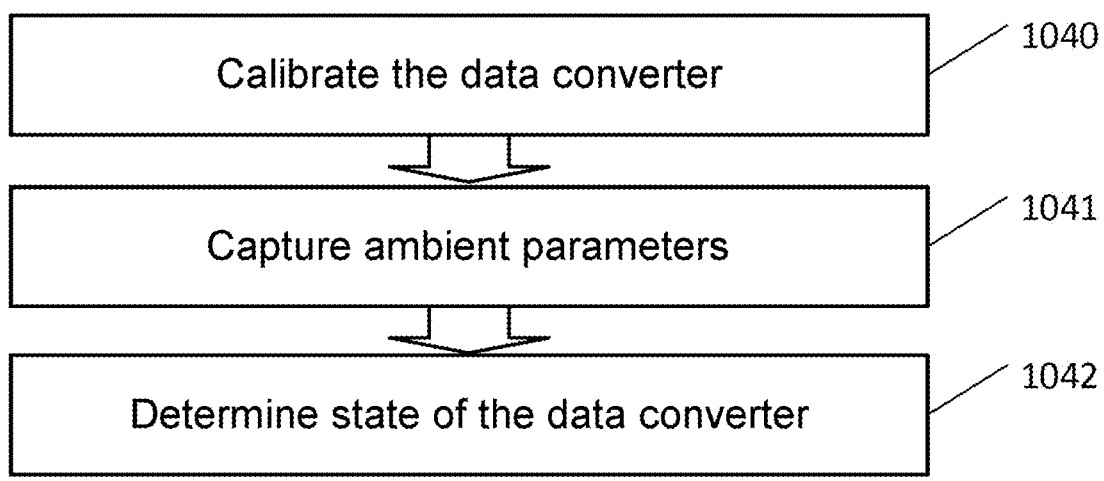
FIG. 3 shows a further flowchart for a method for monitoring a data converter according to various exemplary embodiments.

FIG. 3 shows a further flowchart for a method for monitoring a data converter according to various exemplary embodiments.

At 1040, the data converter is calibrated at a multiplicity of different times. This step can correspond to step 1001 in FIG. 2.

At 1041, at least one time associated ambient parameter is captured. In some exemplary embodiments, the at least one ambient parameter is determined for each time of the multiplicity of different times. In some exemplary embodiments, it is determined only at some times and hence for some of the multiplicity of time associated calibration data records.

The at least one time associated ambient parameter can comprise in each case at least one of the following ambient parameters: temperature and/or supply voltage. Alternatively, other ambient parameters are possible. Applicable approaches are explained below on the basis of examples. In this case, in some examples, only single ambient parameters are mentioned, for example only temperature, in order to facilitate comprehension. This is intended to be understood only as an example and is not intended to be interpreted as limiting. By way of example, it is possible to also use other ambient parameters and/or a combination of various ambient parameters as appropriate.

In this case, the method can further comprise storing the at least one time associated ambient parameter at the multiplicity of different times. In some exemplary embodiments, the at least one time associated ambient parameter can be stored together with time associated calibration data records at a multiplicity of different times. Such storage can have the advantage that comparison of the values of the calibration data records based on values of the at least one ambient parameter is simplified, for example by virtue of values of calibration data records that have been determined at an identical or similar temperature being able to be selected more easily.

In some exemplary embodiments, before the state of the data converter is determined at 1042, normalization can initially be performed if the behavior of the calibration data records, or of individual values of the calibration parameters of the calibration data records, on the basis of the ambient parameter is known. In this case, the multiplicity of time associated calibration data records determined at 1040 or individual calibration parameters thereof are in each case normalized on the basis of the at least one time associated ambient parameter.

By way of example, calibration of the data converter at a first ambient temperature, e.g. 21° C. may have been performed, and a time associated calibration data record may have been determined, at a first time. At a second time, calibration of the data converter may have been performed at a second ambient temperature, e.g. 53° C. In one example, the temperature dependency of the calibration parameter of the calibration data records may be known. Therefore, the value of this calibration parameter for the first calibration data record, which has been determined at the first temperature, can be normalized to the value that would have been determined for a calibration of a prescribed temperature, e.g. 30° C. A corresponding approach can be taken for the other calibration parameters of the first calibration data record if the temperature dependency of the respective parameters is known.

The calibration data record thus normalized can be used as new calibration data record at 1042. A corresponding process can be used for the second calibration data record, which was determined e.g. at the second temperature. By way of example, the second value of this calibration data record can likewise be normalized to the prescribed temperature and used as a new second calibration data record at 1042. In some exemplary embodiments, it may also be possible to normalize the values of calibration parameters of a calibration data record or of multiple calibration data records according to the ambient parameters of a selected calibration data record. In the example indicated above, for example the value of the second calibration data record can be normalized to 21° C. and the value of the first calibration data record may not be normalized.

At 1042, as already mentioned, the state of the data converter is determined. The determining can correspond to the determining described at 1002 or can use parts of the determining described in connection with 1002. Additionally, the determining of the state of the data converter at 1042 is based on the at least one time associated ambient parameter captured at 1041.

In some exemplary embodiments, the normalized calibration data records explained above are used as a basis for the comparison already described, as a result of which the determining of the state involves the ambient parameters.

In some exemplary embodiments, the selecting can be effected such that the at least two time associated ambient parameters for the at least one and the at least one other calibration data record are the same within a prescribed tolerance range. This can mean that the time associated ambient parameters can be captured such that they can be associated with respective calibration data records determined at a multiplicity of different times, for example by virtue of the capture of the ambient parameters and the calibration each being effected at an associable time, for example at the same time or with a small time offset. Association of ambient parameters captured at a first frequency with calibration data records captured at a second frequency is also possible, however, for example by means of interpolation, averaging or other methods. Such association of the ambient parameters with the calibration data records can be taken into consideration for the selection of the calibration data records for the comparison.

By way of example, a particular threshold value may be defined for the case in which the respective calibrations on which the respective calibration data records are based were each performed at a particular temperature, e.g. 21° C., or were each performed at an identical temperature.

If the calibration data records are based on different temperatures, the threshold value can be adapted accordingly. If one calibration is effected at 21° C. and one calibration is effected at 48° C., for example, the threshold value can be changed to a higher value for a comparison of these two calibration data records. This can have the advantage that allowance is made for the influence of ambient parameters on the calibration, which means that a disparity caused by changes in ambient parameters does not lead to incorrect determination of the state of the data converter.

In some exemplary embodiments, the at least two of the multiplicity of time associated calibration data records can also be selected for the comparison on the basis of at least two time associated ambient parameters. This means that calibration data records that have been determined for at least approximately identical ambient parameters are selected for the comparison. In this regard, a tolerance range can be prescribed in order to decide what disparities among the ambient parameters are still tolerated for the selection of the calibration data records. This tolerance range can be stipulated on the basis of properties of the data converters, for example for individual values on the basis of how high the dependency of the values on the ambient parameter is. A suitable design for the tolerance ranges can be determined by means of experiments, for example from measurements at variable temperature.

As a result, it may be possible to avoid comparing calibration data records with one another that have been determined for different ambient parameters. This can have the advantage that, in cases in which the dependency of respective values of the calibration parameters on the ambient conditions is not known, a valid comparison of calibration data records can be ensured.

In some exemplary embodiments, the selecting can be effected such that the associated, at least one, ambient parameters for the at least two calibration data records are the same within a prescribed tolerance range.

By way of example, in one exemplary embodiment, a calibration data record that has been determined at a certain temperature, e.g. 40° C., can be selected only for comparisons with calibration data records that have been determined at approximately this certain temperature, e.g. with a tolerance range of ±5° C., for example between 35° C. and 45° C. This is likewise only an illustrative example, other value ranges and/or criteria are possible.

It is also possible for a combination of the approaches with normalization, selection and determination of a threshold value to be chosen. By way of example, it is possible to select only calibration data records that have been determined in a particular temperature window, e.g. from 35° C. to 45° C., for the comparison, to normalized said calibration data records to a temperature, e.g. 40° C., and to adapt a threshold value stipulated for the comparison of calibration data records determined at 20° C. for this temperature. A single combination of aspects is also possible, for example adaptation and normalization.

It may alternatively and/or additionally also be possible to define one or more absolute threshold values as a comparison data record. By way of example, it may be known, at least for individual values of the calibration data records, in which range the values may lie when the data converter is working correctly. This value range may be known across the entire operating range of the data converter. By way of example, it may be known that a parameter A is always less than 2 for ambient temperatures from 60° to +170° C. when the data converter is working correctly. In such cases, an absolute threshold value of e.g. 2.0 can be stipulated. This absolute threshold value can be stored in the RefRAM 113, for example. This can take place during production, for example. The data converter can then be monitored as appropriate according to the methods described above and below.

Figure 4:
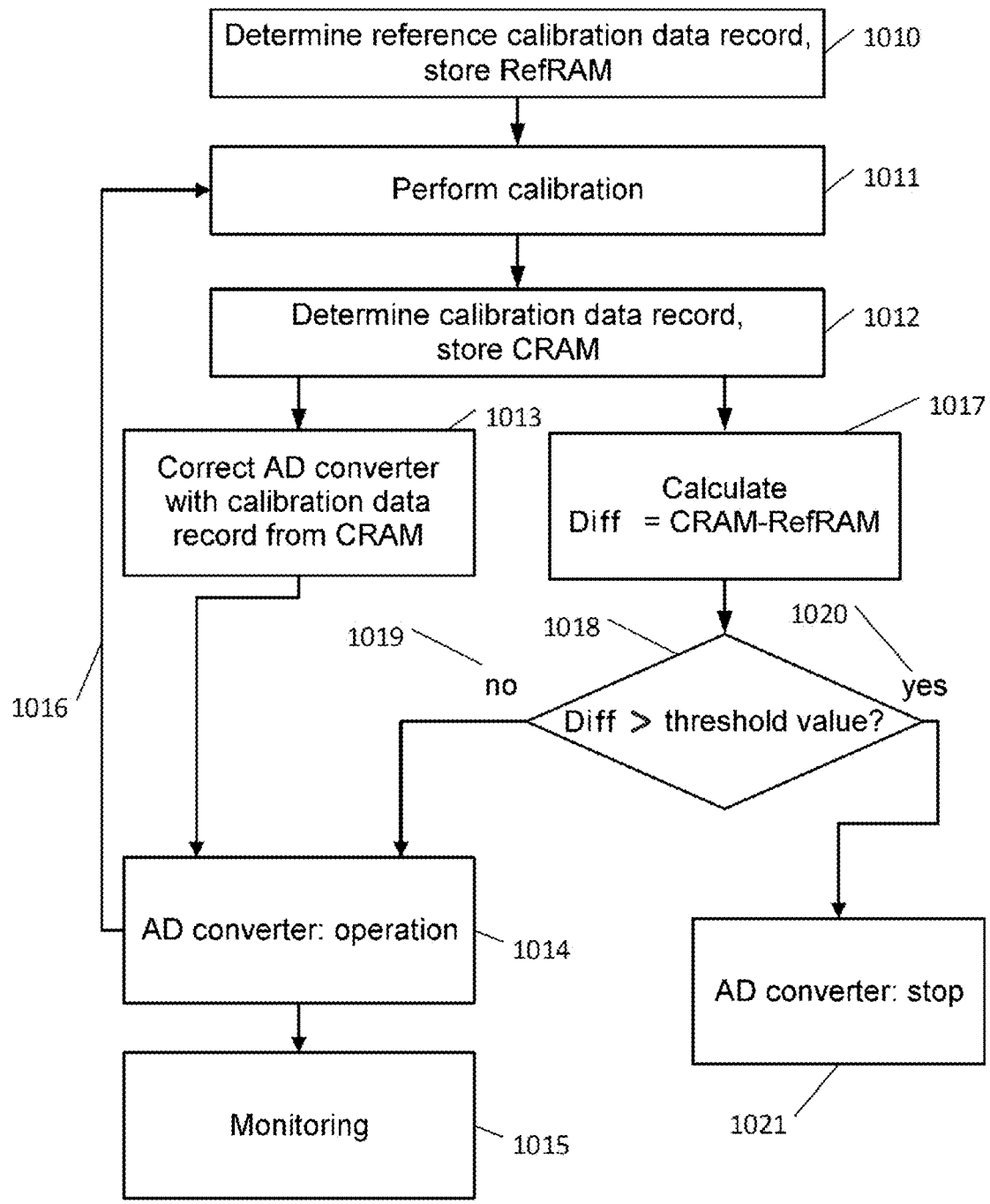
FIG. 4 shows a further flowchart for a method for monitoring a data converter according to various exemplary embodiments.

FIG. 4 shows a further flowchart for a method for monitoring a data converter according to various exemplary embodiments.

In the exemplary embodiment shown in FIG. 4, the converter is an analog to digital converter that has a correction memory CRAM and a reference memory RefRAM. These memories may be implemented in any desired manner, in particular as nonvolatile memories, as already described for RefRAM 113 or CRAM 114 in connection with FIG. 1b. These memories can be used for storing calibration data records. The correction memory is used for storing a present calibration data record, currently used for calibrating the data converter, while the reference memory is used for storing a reference calibration data record, as explained below. Additionally or alternatively, the reference memory and/or the correction memory can also be used to store threshold values as described above and below.

At 1010, determining of at least one reference calibration data record takes place by means of a calibration of the analog to digital converter. This step can be dispensed with in some exemplary embodiments. In some exemplary embodiments, it can be performed at the factory. By way of example, it can be performed for one of the following reasons or else for several of the following reasons: a production test of the data converter, a module test of the data converter, wherein the data converter is coupled to at least one external component, exceeding of a prescribed value of a supply voltage at the data converter, completion of an initialization phase of the data converter.

The at least one reference calibration data record thus obtained can be stored in the reference memory RefRAM.

At 1011, a calibration is performed and a calibration data record is determined. This is performed repeatedly, in particular. The calibration data records can be determined at regular or irregular intervals of time.

At 1012, the calibration data record determined at 1011 is stored in the correction memory CRAM. From 1012, the method can be continued at 1013 and/or at 1017. 1013 and 1017 can be performed at the same time or in succession in this case.

At 1017, comparison of at least two of the multiplicity of time associated calibration data records takes place. In the exemplary embodiment shown in FIG. 4, the calibration data record from the reference memory RefRAM is compared with the calibration data record from the correction memory CRAM. In the exemplary embodiment shown, this comparison takes place by forming a difference. This difference can be calculated in various ways. If the calibration data records each comprise only a single value, the difference can be determined as the difference between the respective values of the two calibration data records. If the calibration data records each comprise more than one calibration parameter, the difference can be calculated from values of mutually corresponding respective calibration parameters.

Mutually corresponding calibration parameters are understood to mean calibration parameters that have the same function within the calibration data record, e.g. are used at the same point when correcting converted signals.

By way of example, the value of a particular calibration parameter of the calibration data record stored in the reference memory RefRAM can be subtracted from the value of the corresponding calibration data record stored in the correction memory CRAM in order to determine the difference. It should be noted that in other exemplary embodiments, as described above, it is also possible for other comparison operations to take place. Likewise, it is possible for further calculation operations with the values of the calibration data records to be effected either while the calibration data records are determined or as a prior step before the calibration data records are compared. By way of example, quotients of the calibration data records can be formed and subsequently compared with one another.

At 1018, based on the comparison of the at least two of the multiplicity of time associated calibration data records at 1017, the state of the data converter is determined. In the exemplary embodiment shown in FIG. 4, the state of the data converter is determined as logical information. In the exemplary embodiment shown, the state is determined by checking whether the difference determined at 1017 is greater than a difference threshold value. In exemplary embodiments in which other forms of calculation are chosen for determining the state, corresponding threshold values can be chosen, for example a quotient threshold value, in order to determine the state. As described above, in other exemplary embodiments, other forms of state description can be used. In exemplary embodiments in which the calibration data records comprise a multiplicity of values, the state can also be determined on the basis of joint consideration of the component by component comparison of individual associated values. The joint consideration can consist in addition of the determined differences or in addition of the squares of the absolute values of the determined differences, for example, or in a consideration of that associated value pair with the maximum difference. It is also possible for other methods to be used, as are known from the realm of curve fits, for example. By way of example, it may be known that individual values in a calibration data record have a particular dependency in relation to one another, for example a square characteristic of the values as a function of an index of the values. In such cases, curve fits can be performed and ascertained residues of the curve fits from calibration data records can be compared with one another.

The state of the data converter can comprise a degradation state. In some exemplary embodiments, the degradation state can be ascertained based on the absolute value of the difference determined at 1017, for example as a variable normalized to between 0 and 100%, the variable being determined at 100% when the difference has the value 0 and being determined at 0% when the difference reaches or exceeds the difference threshold value. In this case, it is likewise possible for the degradation state to be made up of a multiplicity of such values as can be determined from the respective values of calibration data records or from apportionment of respective values of calibration data records. Based on the degradation state, a signal that is a measure of the degradation state of the data converter can be provided.

On the basis of the state of the data converter that is determined at 1018 and/or the corresponding signal, the method can be continued differently. If a state is determined that indicates that the data converter is fully usable, the method can be continued at step 1014, as indicated by the arrow 1019. If, on the other hand, a state is determined that indicates that the data converter is not usable or is potentially at risk of failure, the method can be continued at 1021, as indicated by the arrow 1020. To this end, the signal that is a measure of the degradation state of the data converter can be used by the monitoring circuit 103 to perform control concerning whether the method is continued at 1014 or at 1021.

At 1014, the analog to digital converter is operated. In this case, the operation can be effected on the basis of the calibration data record stored in the correction memory CRAM. If 1013 has not yet been executed, the operation can likewise be effected on the basis of the calibration data record stored in the reference memory RefRAM.

At 1013, the analog to digital converter is corrected based on the calibration data record stored in the correction memory CRAM.

As shown by the arrow 1016, the method can be continued at 1011.

If, at 1018, a state of the data converter is determined that indicates that the data converter is not ready for use, the method is continued at 1021.

At 1021, a warning is output and/or another suitable measure, such as shutdown of the data converter, is performed. The shutdown can be effected by means of the shutdown circuit 105 in this case. The warning can be output to the input/output 109 or the input/outputs 109 by the monitoring circuit 103 via the bus 106. The shutdown can be effected based on the measure of the degradation state of the data converter, as explained at 1018.

Figure 7:
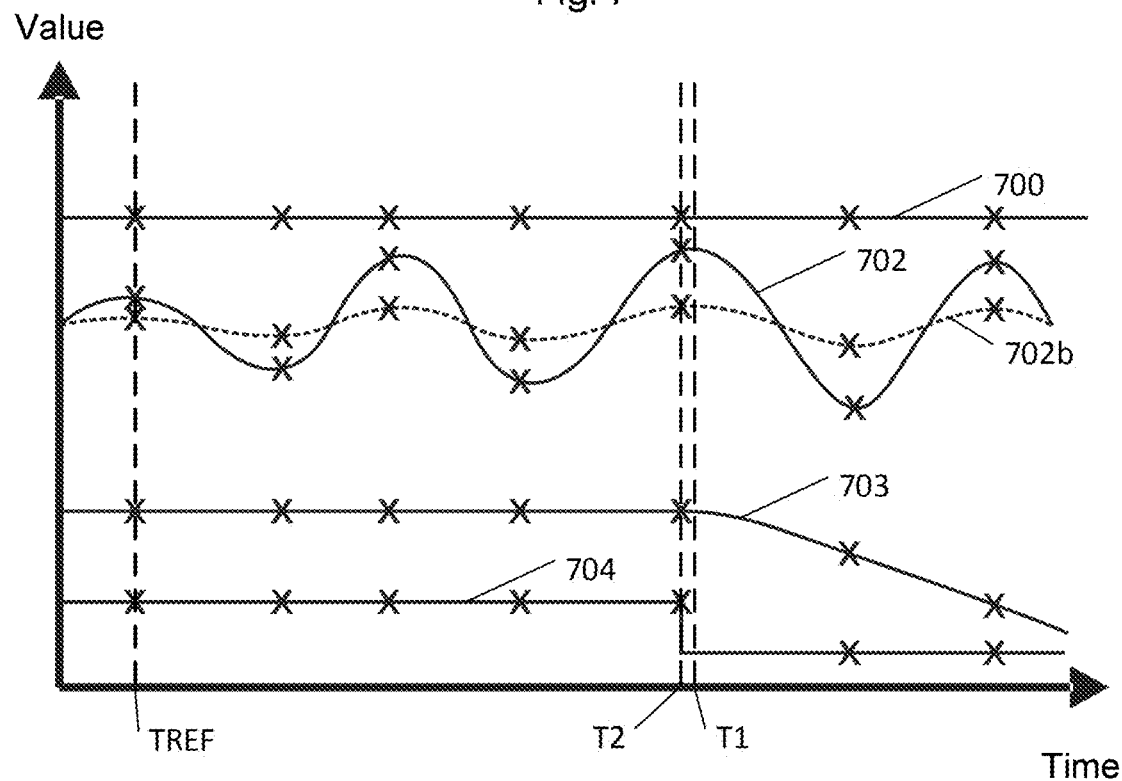
FIG. 7 schematically shows various possible time characteristics of values of calibration parameters.

FIG. 7 schematically shows various possible time characteristics of values of calibration parameters.

The curves 700-704 show the respective values of arbitrary, different calibration parameters as a function of time.

At various times, time associated values can be determined by means of a calibration, as described above. These values for respective measurements are indicated as crosses in the curves 700-704. A first measurement can be taken at a reference time TREF, for example. In some exemplary embodiments, the value ascertained at TREF can be stored in the RefRAM 113. Comparison of the values can be effected, in some examples, between a value ascertained at the time TREF and a second value ascertained at a later time. A second value can be stored in the CRAM 114, for example. It is also possible for values ascertained later to be compared with one another, however, which are all stored in the CRAM 114, for example, or a multiplicity of values, or other variants, as described above.

A first example of a possible characteristic of a value of a calibration parameter is shown by the curve 700. In the example shown by curve 700, the value is substantially constant as a function of time. This can indicate that the data converter is working as desired.

In the example of curve 702, the value is likewise substantially constant, but it fluctuates from measurement to measurement. This can occur for example on account of changing ambient conditions, for example temperature variations in the data converter. In accordance with methods described above, the values of the curve 702 can be compared with one another and the disparity can be used to infer whether or not the data converter is working correctly. Such ascertainment can be performed by the monitoring circuit 103 of FIG. 1*a* and FIG. 1*b*, for example.

The curve 702*b* schematically shows the values of the curve 702, the values having been normalized from time associated ambient parameters as appropriate. By way of example, this can be effected by virtue of at least one of the sensors 110 112 having been used to detect the temperature for each calibration time, and the temperature dependency of the calibration parameter being known. In the example shown by curve 702*b*, the normalized curve 702*b* shows distinctly smaller variations than the non-normalized curve 702. This can be taken into consideration for the comparison, for example a smaller disparity in the normalized curve 702b can itself lead to it being inferred that the data converter is not working properly. Conversely, greater disparity in the non-normalized curve 702 can also be tolerated, and a malfunction in the data converter inferred only in the event of a greater disparity between two calibration parameter values.

Curve 703 shows an example of a signal characteristic that can initially indicate that the data converter is working properly. From the time T1 onward, the curve 703 shows a continuous fall, which can indicate aging of the data converter.

The curve 704 likewise initially shows a proper characteristic, but at the time T2 the curve exhibits a jump in the value of the calibration parameter. This can indicate sudden failure of the data converter.

The described curves and characteristic shapes of the curves are merely an example. In the examples of curves 703 and 704, falling values have been chosen as an example in order to infer impediment of the state of the data converter. Other characteristic shapes, for example rising values, are also conceivable.

Figure 5:
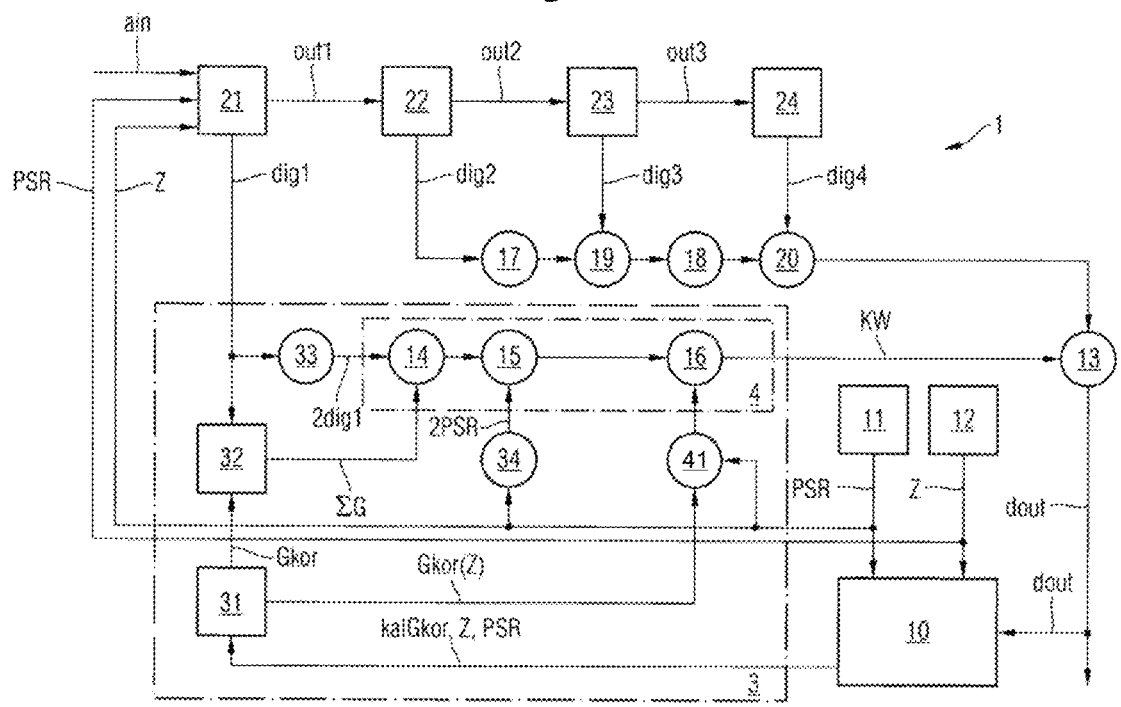
FIG. 5 shows a pipeline analog to digital converter according to various exemplary embodiments.

FIG. 5 shows a pipeline analog to digital converter according to various exemplary embodiments.

The analog to digital converter 1 shown in FIG. 5 can be an example of the described data converter 101.

By way of example, the analog-to-digital converter 1 has four converter stages 21-24. The first converter stage 21 provides a digital converter output value dig1 and an amplified sampled analog output signal out1, weighted with a weighting value tatG, for a received analog input signal ain. For each converter stage 21-24, there is provision for a correction apparatus 3.

FIG. 5 depicts only the correction apparatus 3 for the first converter stage 21. For reasons of clarity, the correction apparatuses for the other converter stages 22-24 are not portrayed.

The correction apparatus 3 has a first memory 31, a second memory 32, a first shifting apparatus 33 and a combinational logic apparatus 4. The first memory 31 provides at least one weighting correction value Gkor, corresponding to a difference between the actual weighting value tatG and an ideal weighting value idG of the converter stage 21, for each capacitor unit K1-K16 of the converter stage 21, the added output values of which form the digital converter output value dig1.

$$Gkor = tatG - idG \tag{1}$$

Such weighting values can be an example of values of calibration data records.

The second memory 32 provides an aggregate weighting correction value IG, corresponding to a sum of the weighting correction values Gkor of the capacitor units K1-K16 actuated by means of the respective converter output value dig1, for each digital converter output value dig1.

Calibration data records can likewise comprise values of such correction values.

The first shifting apparatus 33 doubles the digital converter output value dig1 to form an ideally weighted digital converter output value 2dig1. An ideal bit weighting by the factor 2 corresponds in binary to a shift in the digital converter output value dig1 by one bit position to the left.

The combinational logic apparatus 4 logically combines the aggregate weighting correction value IG and the doubled digital converter output value 2dig1 to produce a corrected output value KW.

The corrected output value KW is used to correct the digital output value dout by the gain error and by the changeover error.

In other words, the received analog input signal is (partially) converted by the data converter using a calibration determined by a calibration data record. According to the architecture of pipeline ADCs, the complete conversion is effected by repeating the method described here in connection with the converter stage 21 for the remaining converter stages 22-24 in order to obtain the output signal dout after a summation at 13.

In the example shown for the pipeline architecture, it is possible for calibration data records to be monitored for each converter stage 21-24 as described above. These can also be monitored as a calibration data record for the entire pipeline ADC, or monitored separately for individual converter stages 21-24, as described above.

By way of example, the analog to digital converter 1 has a first summation apparatus 13 that adds the digital converter output values dig1-dig4 of the converter stages 21-24 to produce the digital output value dout.

By way of example, the analog to digital converter 1 also has a random number generator 11 that generates a digital random value PSR.

Further, there may be provision for a control apparatus 10 that calibrates a respective weighting correction value Gkor of a unit capacitor C0 C64 by means of the random value PSR supplied to the signal path of the analog to digital converter 1 and updates the respective associated weighting correction value Gkor of the unit capacitor C0-C64, which is stored in the first memory 31, by means of the calibrated weighting correction value kalGkor.

The control apparatus 10 is thus capable of calibrating the data converter at a multiplicity of different times in order to determine a corresponding multiplicity of time associated calibration data records.

Additionally, the analog to digital converter 1 can have a counting apparatus 12 providing a respective pointer Z that is uniquely associated with the unit capacitor C0-C64 to be calibrated by the control apparatus 10. The counting apparatus 12 feeds the pointer Z together with the random signal PSR into the signal path of the analog to digital converter 1 or into the first converter stage 21. In addition, the counting apparatus 12 provides the pointer Z at the input of the control apparatus 12.

Preferably, the control apparatus 10 updates the weighting correction value Gkor of the unit capacitor C0-C64 that is currently to be calibrated, which is stored in the first memory 31, by means of the pointer Z received at the input and the calibrated weighting correction value kalGkor.

By way of example, the control apparatus 10 generates the calibrated weighting correction value kalGkor of the unit capacitor C0-C64, which is stipulated by the present pointer Z in each case, by means of the random value PSR and the digital output value dout.

The first memory 31 likewise receives the present pointer Z from the control apparatus 10 and provides the weighting correction value Gkor(Z) for the respective unit capacitor C0 C64 to which the received present pointer Z points.

There can additionally be provision for a second shifting apparatus 34 that produces a doubled random value 2PSR by doubling the present random value PSR, the doubling corresponding to a multiplication by the ideal weighting value idG. The ideal weighting value idG is preferably 2 and the second shifting apparatus 34 doubles the present random value PSR by means of a shift by one bit position to the left.

The combinational logic apparatus 4 can have a second summation apparatus 14 that adds the aggregate weighting correction value IG and the doubled converter output value 2dig1.

Further, the combinational logic apparatus 4 can have a first subtraction apparatus 15 that subtracts the doubled random value 2PSR from the sum of the aggregate weighting correction value IG and the doubled converter output value 2dig1.

The analog to digital converter 1 can further have a multiplication apparatus 41 that multiplies the weighting correction value Gkor(Z) provided by the first memory 31 by the random value PSR of the random number generator 11.

The combinational logic apparatus 4 can also contain a second subtraction apparatus 16 that subtracts the weighted correction value Gkor(Z) of the multiplication apparatus 41, multiplied by the random value PSR, from the difference between the sum of the aggregate weighting correction value IG and the doubled converter output value 2dig1 and the doubled random value 2PSR.

The third shifting apparatus 17 and the fourth shifting apparatus 18 double the binary value of the digital converter output value dig2 of the second converter stage 22 and the digital value of the digital converter output value dig3 of the third converter stage 23. The third and fourth summation apparatuses 19 and 20 add the doubled converter output values dig2 and dig3 and the converter output value dig4 to produce the digital converter output value dout of the analog to digital converter 1.

There can be provision for at least two converter stages 21, 22, and the analog to digital converter 1 may be of fully differential design.

Figure 6:
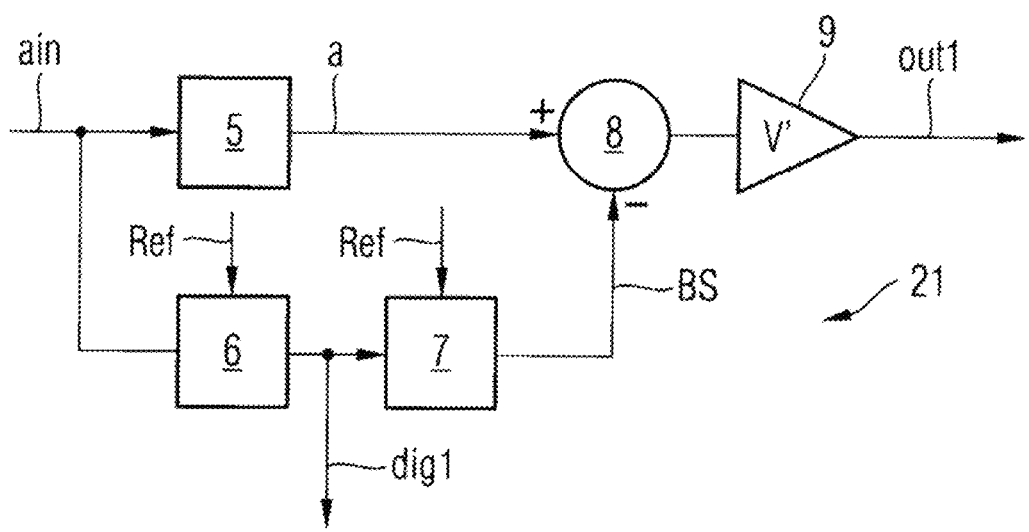
FIG. 6 shows a schematic block diagram of a converter stage as shown in FIG. 5.

FIG. 6 shows a schematic block diagram of a converter stage as shown in FIG. 5.

FIG. 6 shows an example of a first converter stage 21 of FIG. 5. The further converter stages 22-24 may be in corresponding form. The first converter stage 21 has a sample & hold circuit 5, a comparator unit 6, a digital to analog converter 7, a subtraction apparatus 8 and an amplification apparatus 9.

The sample and hold circuit 5 samples the analog input signal ain and thus provides a sampled analog input signal a.

The comparator unit 6 compares the analog input signal ain with a reference value Ref to produce the digital converter output value dig1. The digital to analog converter 7 converts the digital converter output value dig1 into an analog DR converter output signal BS by means of the capacitor units K1 K16.

$$BS = dig1/b * \text{Ref} \quad (2)$$

The parameter b denotes the number of comparators of the comparator unit, and b is 16, for example.

Preferably, the digital to analog converter 7 has calibration capacitor C0 for calculating the weighting correction values Gkor of the unit capacitors C1-C64 of the capacitor units K1-K64 (not shown), said calibration capacitor being in the form of a unit capacitor.

The subtraction apparatus 8 subtracts the analog DA converter output signal BS delivered by the digital to analog converter 7 from the sampled input signal a. The amplification apparatus 9 amplifies the output signal output by the subtraction apparatus 8 using a predetermined gain factor V, which corresponds to the real gain factor of the amplification apparatus 9, to produce the analog output signal out1.

$$out1 = V' * (a - dig1/b * \text{Ref}) \quad (3)$$

Preferably, the comparator unit 6 codes the digital converter output value dig1 according to a thermometer code, and the capacitor units K1-K6 each have a predetermined number of unit capacitors C1-C64. This simplifies manufacture of the capacitor units and of the calibration capacitor considerably.

The actual weighting value tatG is formed by the analog DA converter output signal BS amplified using the actual gain factor V of the amplification apparatus 9 (see equation 5).

$$out1 = V' * a - V' * dig1/b * \text{Ref} \quad (4)$$

$$tatG = V' * dig1/b * \text{Ref} \quad (5)$$

As explained above (cf. equation (1)), the weighting correction value Gkor corresponds to the difference between the actual weighting value tatG and the ideal weighting value idG.

Therefore, the converter stage shown in FIG. 6 converts an analog input signal into a digital signal on the basis of a calibration determined by a calibration data record. The data converter shown in connection with FIGS. 5 and 6 may be monitored by means of the methods described above or may be an element of the apparatuses and/or systems described above.

Figure 8:
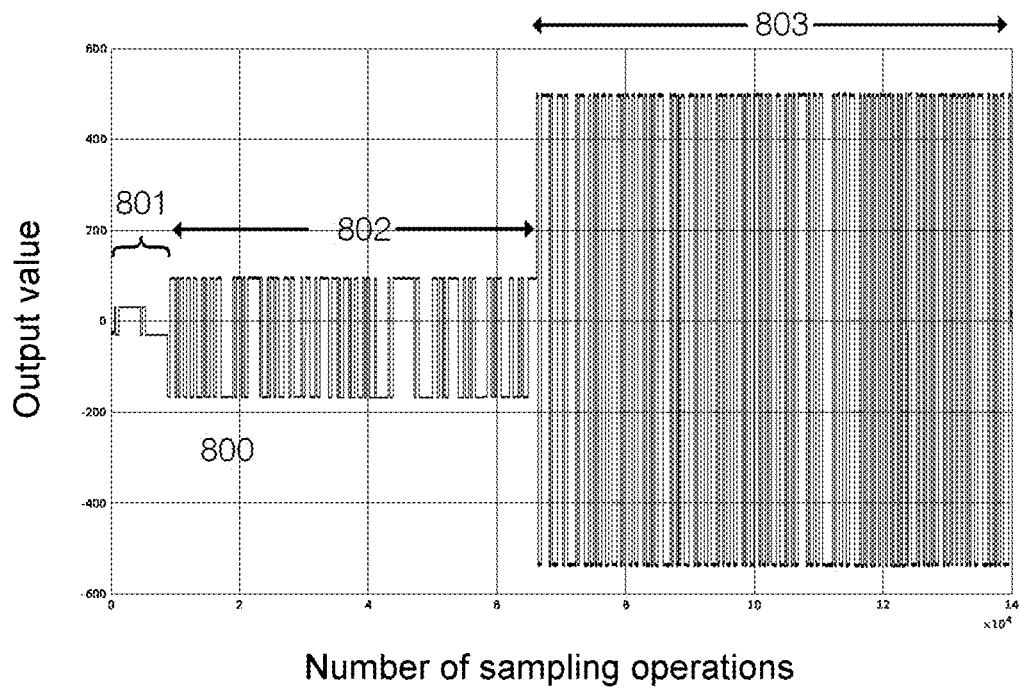
FIG. 8 shows an example of a signal of a data converter during a calibration.

FIG. 8 shows an example of a signal of a data converter 800 during a calibration.

FIG. 8 shows an output value 800 (output code) showing the result of a calibration signal, that is to say the calibration signal modified with an error of the data converter, as a function of the number of sampling operations. 801 shows the result of a third converter stage, for example from converter stage 23 of FIG. 5. 802 shows a result of a second converter stage, for example a result from converter stage 22 of FIG. 5. 803 shows a result of a first converter stage, for example from converter stage 21 of FIG. 5. The calibration signal provided at ain in FIG. 5, for example, is a power supply rejection (PSR) signal in the example shown. The calibration method can comprise averaging the output values and subtracting an ideal result, which may be known, in order to ascertain the errors.

The errors thus ascertained can be used to adapt the calibration parameters, and repeated performance allows values for the calibration parameters to be obtained for the respective calibration time.

The signal 800 can be determined in various ways. In the example of FIG. 7, the signal 800 is determined for the first three converter stages 21, 22, 23 of the pipeline analog to digital converter shown in FIG. 5. Such a converter can comprise what is known as a delta memory (delta RAM, DRAM), storing calibration parameters for each capacitor in each of the three converter stages. The correction of the individual converter stages of the analog to digital converter can be calculated from these DRAM values. This can be effected by virtue of the values stored in the DRAM being combined with a set of correction coefficients for the respective converter stage. These correction coefficients may be stored in a further register, referred to as a sigma memory (sigma RAM, SRAM). The calculation of the SRAM values can be performed as follows:

For the third converter stage 23, for example stored in SRAM(0) to SRAM(6), the calculation can be effected as follows, the register index in the memory being indicated between parentheses:

$$SRAM(0) = DRAM(0) * 0$$

$$SRAM(1) = DRAM(0) * 2$$

SRAM(2)=SRAM(1)+DRAM(0)*2

SRAM(3)=SRAM(2)+DRAM(0)*2

SRAM(4)=SRAM(3)+DRAM(0)*2

SRAM(5)=SRAM(4)+DRAM(0)*2

SRAM(6)=SRAM(5)+DRAM(0)*2

A similar process can be used for the second converter stage 22 (SRAM(7) to SRAM(13)):

SRAM(7)=DRAM(1)*0

SRAM(8)=SRAM(7)+DRAM(1)*2

SRAM(9)=SRAM(8)+DRAM(2)*2

SRAM(10)=SRAM(9)+DRAM(3)*2

SRAM(11)=SRAM(10)+DRAM(4)*2

SRAM(12)=SRAM(11)+DRAM(5)*2

SRAM(13)=SRAM(12)+DRAM(6)*2

A similar process can likewise be used for the first converter stage 21 (SRAM(14) to SRAM(22)):

SRAM(14)=DRAM(8)*0

SRAM(15)=DRAM(8)*2

SRAM(16)=SRAM(15)+DRAM(9)*2

SRAM(17)=SRAM(16)+DRAM(10)*2

SRAM(18)=SRAM(17)+DRAM(11)*2

SRAM(19)=SRAM(18)+DRAM(12)*2

SRAM(20)=SRAM(19)+DRAM(13)*2

SRAM(21)=SRAM(20)+DRAM(14)*2

SRAM(22)=SRAM(21)+DRAM(15)*2

The values thus stored in the SRAM can correspond to the calibration data records. In the example of FIG. 4, the calibration data records stored in the SRAM can also be stored in the CRAM. The SRAM values can alternatively be processed further in order to store a smaller number of values as calibration parameters in the CRAM.

According to various exemplary embodiments, a multiplicity of time associated calibration data records may be available, for example in the memory. In such cases, it is possible for the state of the data converter, as described above, to be determined by comparison of various calibration data records.

At least some embodiments are defined by the examples listed below:

Example 1

Method for monitoring a data converter, wherein the data converter is configured to convert data using a calibration determined by a calibration data record, comprising: calibrating the data converter in order to determine a corresponding multiplicity of time associated calibration data records at a multiplicity of different times, determining a state of the data converter based on comparison of at least one of the multiplicity of time associated calibration data records with a comparison data record.

Example 2

Method according to example 1, wherein the comparison data record comprises at least one other of the time associated calibration data records.

Example 3

Method according to example 1 or 2, wherein the comparison data record comprises at least one threshold value.

Example 4

Method according to one of the preceding examples, wherein each of the multiplicity of time-associated calibration data records comprises a multiplicity of calibration parameters having respective values, and the comparison data record comprises a multiplicity of comparison values, wherein the comparison comprises comparison of values with respective corresponding comparison values.

Example 5

Method according to one of the preceding examples, wherein the method further comprises: capturing at least one time associated ambient parameter at at least some of the multiplicity of different times, wherein the determining of the state of the data converter is further based on the at least one time associated ambient parameter.

Example 6

Method according to example 5, further comprising normalizing at least some of the multiplicity of time associated calibration data records in each case on the basis of the at least one time associated ambient parameter.

Example 7

Method according to example 2 and either of examples 5 and 6, wherein the comparison comprises comparison of a difference threshold value with a difference between the at least one calibration data record and the at least one other calibration data record, wherein the difference threshold value is determined based on the at least one time associated ambient parameter.

Example 8

Method according to example 2 and one of examples 5-7, wherein at least two time associated ambient parameters are captured and the at least one and the at least one other calibration data record are selected for the comparison from the multiplicity of time associated calibration data records on the basis of the at least two time associated ambient parameters.

Example 9

Method according to example 8, wherein the selecting is effected such that the at least two time associated ambient parameters for the at least one and the at least one other calibration data record are the same within a prescribed tolerance range.

Example 10

Method according to one of examples 5-9, wherein the method further comprises storing the at least one time associated ambient parameter and/or storing at least one of the time associated calibration data records.

Example 11

Method according to one of examples 5-10, wherein the at least one time associated ambient parameter comprises in each case at least one of the following ambient parameters: temperature and/or supply voltage.

Example 12

Method according to one of the preceding examples, wherein the at least one calibration data record and the comparison data record comprise at least one reference calibration data record and a second time associated calibration data record, and wherein the determining of the state of the data converter is effected based on a comparison of the at least one reference calibration data record with the second time associated calibration data record, wherein the at least one reference calibration data record is obtained by calibrating the data converter for one of the following reasons: a production test of the data converter, a module test of the data converter, wherein the data converter is coupled to at least one external component, exceeding of a prescribed value of a supply voltage at the data converter, completion of an initialization phase of the data converter.

Example 13

Method according to one of the preceding examples, wherein the state of the data converter comprises a degradation state.

Example 14

Method according to example 13, wherein the method further comprises: providing at least one signal based on the degradation state of the data converter, wherein the at least one signal is a measure of the degradation state of the data converter.

Example 15

Method according to example 14, wherein the method further comprises: shutting down the data converter and/or outputting a warning based on the measure of the degradation state of the data converter.

Example 16

Apparatus for data conversion, comprising: a data converter, wherein the data converter is configured to convert data using a calibration determined by a calibration data record, a calibration circuit configured to determine a corresponding multiplicity of time associated calibration data records at a multiplicity of different times, a monitoring circuit configured to determine a state of the data converter based on comparison of at least one of the multiplicity of time associated calibration data records with a comparison data record.

Example 17

Apparatus for data conversion according to example 16, additionally comprising: a signal interface configured for providing at least one signal based on the state of the data converter and/or a shutdown circuit configured for shutting down the data converter based on the state of the data converter.

Example 18

Apparatus for data conversion according to example 16 or 17, wherein the monitoring circuit is configured to perform the method according to examples 1-15.

Example 19

Apparatus for data conversion according to one of examples 16-18, wherein the data converter is an analog to digital converter and/or a digital to analog converter.

Example 20

System for converting data, comprising: a data converter, wherein the data converter is configured to convert data using a calibration determined by a calibration data record, a monitoring circuit for the data converter, wherein the monitoring circuit for the data converter is configured to perform the method according to one of examples 1-15.

Although specific exemplary embodiments have been illustrated and described in this description, persons with the usual knowledge in the art will recognize that a large number of alternative and/or equivalent implementations can be chosen as a substitution for the specific exemplary embodiments shown and described in this description without departing from the scope of the invention that is shown. It is the intension for this application to cover all adaptations or variations of the specific exemplary embodiments that are discussed here. This invention is thus intended to be restricted only by the claims and the equivalents of the claims.

What is claimed is:

1. A method for monitoring a data converter configured to convert data using a calibration determined by a calibration data record, the method comprising:
   calibrating the data converter in order to determine a multiplicity of time associated calibration data records that describe a linearity of the data converter at a multiplicity of different times, wherein the data converter comprises an analog to digital converter or a digital to analog converter, and wherein the multiplicity of time associated calibration data records are associated with sub-components of the data converter, are stored in a memory, are configured to correct a non-linear response of an output signal of the data converter with respect to an applied input signal, and are separate from an output of the data converter; and
   determining a state of health of the data converter based on comparing a first calibration data record of the multiplicity of time associated calibration data records with a second calibration data record of the multiplicity of time associated calibration data records different from the first calibration data record, wherein the first calibration data record and the second calibration data record each describe the linearity of the data converter at different times from each other, and the state of health of the data converter indicates a life expectancy or a probability of failure of the data converter.

2. The method as claimed in claim 1, wherein the method further comprises capturing at least one time associated ambient parameter at at least two of the multiplicity of different times, wherein the determining of the state of health of the data converter is further based on the at least one time associated ambient parameter, and
  wherein the comparing the first calibration data record with the second calibration data record comprises comparing of a difference threshold value with a difference between the first calibration data record and the second calibration data record, wherein the difference threshold value is determined based on the at least one time associated ambient parameter.

3. The method as claimed in claim 1, wherein the method further comprises capturing at least one time associated ambient parameter at at least two of the multiplicity of different times, wherein the determining of the state of health of the data converter is further based on the at least one time associated ambient parameter,
  wherein at least two time associated ambient parameters are captured, and
  wherein the first calibration data record and the second calibration data record are selected for the comparing from the multiplicity of time associated calibration data records based on the at least two time associated ambient parameters.

4. The method as claimed in claim 3, wherein the selecting is effected such that the at least two time associated ambient parameters for the first calibration data record and the second calibration data record are the same within a prescribed tolerance range.

5. The method as claimed in claim 1, wherein the second calibration data record further comprises at least one threshold value.

6. The method as claimed in claim 1, wherein each of the multiplicity of time associated calibration data records comprises a multiplicity of calibration parameters having respective values, and the second calibration data record comprises a multiplicity of comparison values, and
  wherein the method further comprises comparing the respective values with the multiplicity of comparison values.

7. The method as claimed in claim 1, wherein the method further comprises:
  capturing at least one time associated ambient parameter at at least two of the multiplicity of different times, wherein the determining of the state of health of the data converter is further based on the at least one time associated ambient parameter.

8. The method as claimed in claim 7, further comprising normalizing at least two of the multiplicity of time associated calibration data records in each case on the basis of the at least one time associated ambient parameter.

9. The method as claimed in claim 7, further comprising storing the at least one time associated ambient parameter and/or storing the at least one of the multiplicity of time associated calibration data records.

10. The method as claimed in claim 7, wherein the at least one time associated ambient parameter comprises in each case at least one of the following ambient parameters:
  temperature or supply voltage.

11. The method as claimed in claim 1,
  wherein the first calibration data record and the second calibration data record comprise at least one reference calibration data record and a second time associated calibration data record,
  wherein the determining of the state of health of the data converter is effected based on a comparison of the at least one reference calibration data record with the second time associated calibration data record,
  wherein the at least one reference calibration data record is obtained by calibrating the data converter for one of the following reasons:
    a production test of the data converter,
    a module test of the data converter, wherein the data converter is coupled to at least one external component,
    exceeding of a prescribed value of a supply voltage at the data converter, or
    completion of an initialization phase of the data converter.

12. The method as claimed in claim 1, wherein the state of health of the data converter comprises a degradation state, wherein the degradation state is an indication of a degree to which the life expectancy of the data converter has been degraded.

13. The method as claimed in claim 12, wherein the method further comprises:
  providing at least one signal based on the degradation state of the data converter, wherein the at least one signal is a measure of the degradation state of the data converter.

14. The method as claimed in claim 13, wherein the method further comprises:
  shutting down the data converter or outputting a warning based on the measure of the degradation state of the data converter.

15. An apparatus for data conversion, comprising:
  a data converter configured to convert data using a calibration determined by a calibration data record, wherein the data converter comprises an analog to digital converter or a digital to analog converter, and;
  a calibration circuit configured to determine a multiplicity of time associated calibration data records that describe a linearity of the data converter at a multiplicity of different times, wherein the multiplicity of time associated calibration data records are associated with subcomponents of the data converter, are stored in a memory, and are configured to correct a non-linear response of an output signal of the data converter with respect to an applied input signal, and are separate from an output of the data converter; and
  a monitoring circuit configured to determine a state of health of the data converter based on comparison of a first calibration data record of the multiplicity of time associated calibration data records with a second calibration data record of the multiplicity of time associated calibration data records different from the first calibration data record, wherein the first calibration data record and the second calibration data record each describe the linearity of the data converter at different times from each other, and the state of health of the data converter indicates a life expectancy or a probability of failure of the data converter.

16. The apparatus for data conversion as claimed in claim 15, further comprising:
  a signal interface configured for providing at least one signal based on the state of health of the data converter; or
  a shutdown circuit configured for shutting down the data converter based on the state of health of the data converter.

17. A system for converting data, comprising:
  a data converter, wherein the data converter comprises an analog to digital converter or a digital to analog converter, and wherein the data converter is configured to convert data using a calibration determined by a calibration data record, a monitoring circuit for the data converter, wherein the monitoring circuit for the data converter is configured to:

calibrate the data converter in order to determine a multiplicity of time associated calibration data records that describe a linearity of the data converter at a multiplicity of different times, wherein the multiplicity of time associated calibration data records are associated with sub-components of the data converter, are stored in a memory, and are configured to correct a non-linear response of an output signal of the data converter with respect to an applied input signal, and are separate from an output of the data converter; and determine a state of health of the data converter based on comparing a first calibration data record of the multiplicity of time associated calibration data records with a second calibration data record of the multiplicity of time associated calibration data records different from the first calibration data record, wherein the first calibration data record and the second calibration data record each describe the linearity of the data converter at different times from each other, and the state of health of the data converter indicates a life expectancy or a probability of failure of the data converter.

18. The method as claimed in claim 1, wherein:
the data converter comprises a pipeline analog to digital converter; and
the sub-components of the data converter comprise pipeline converter stages.

19. The method as claimed in claim 18, wherein the multiplicity of time associated calibration data records describe weighting correction factors for the pipeline converter stages.

20. The apparatus for data conversion as claimed in claim 15, wherein the second calibration data record further comprises at least one threshold value.

21. The system of claim 17, wherein the second calibration data record further comprises at least one threshold value.

* * * * *